United States Patent
Tanabe et al.

[11] Patent Number: 5,994,022
[45] Date of Patent: Nov. 30, 1999

[54] RADIATION SENSITIVE RESIN COMPOSITION

[75] Inventors: Takayoshi Tanabe; Eiichi Kobayashi; Makoto Shimizu; Shin-ichiro Iwanaga, all of Mie, Japan

[73] Assignee: JSR Corporation, Tokyo, Japan

[21] Appl. No.: 08/965,432

[22] Filed: Nov. 6, 1997

[30] Foreign Application Priority Data

Nov. 14, 1996 [JP] Japan .................................. 8-316888

[51] Int. Cl.$^6$ ..................................................... G03F 7/004
[52] U.S. Cl. ...................... 430/170; 430/270.1; 430/905; 430/908; 430/910; 430/920
[58] Field of Search ................................. 430/170, 270.1, 430/905, 920, 910, 908

[56] References Cited

U.S. PATENT DOCUMENTS

| | | | |
|---|---|---|---|
| 4,600,683 | 7/1986 | Greco et al. | 430/270.1 |
| 4,925,768 | 5/1990 | Iwasaki et al. | 430/905 |
| 5,759,739 | 6/1998 | Takemura et al. | 430/270.1 |

FOREIGN PATENT DOCUMENTS

| | | |
|---|---|---|
| 0 422 628 | 4/1991 | European Pat. Off. . |
| 0 660 187 | 6/1995 | European Pat. Off. . |

*Primary Examiner*—John S. Chu
*Attorney, Agent, or Firm*—Oblon, Spivak, McClelland, Maier & Neustadt, P.C.

[57] ABSTRACT

A radiation sensitive resin composition useful as a chemically amplified positive tone resist is provided. The composition comprises (A) a copolymer which becomes soluble in an alkali developing solution by the action of an acid, the copolymer containing a recurring unit (I) having a structure which is decomposed by the action of an acid and increases the solubility in an alkaline developing solution and a recurring unit(II) obtained from a compound having at least two (meth)acryloyl groups in the molecule by the cleavage of the carbon-carbon double bond, and (B) a photoacid generator which produces an acid on being irradiated by a radiation. The composition exhibits high resolution, superb capability of producing superior pattern forms, and excellent resistance to PED, and high process stability, is affected by a standing wave only to a minimum extent, and possessed prominent heat resistance.

20 Claims, No Drawings

RADIATION SENSITIVE RESIN COMPOSITION

BACKGROUND OF THE INVENTION

1. Field of the Invention

The present invention relates to a radiation sensitive resin composition and, more particularly, to a radiation sensitive resin composition useful as a chemically amplified positive tone resist which is suitable for use in precision machining utilizing various types of radiation such as ultraviolet light, deep ultraviolet light, X-rays, or charged particle rays.

2. Description of the Background Art

Miniaturization of a design rule in lithography has been undergoing rapid progress in fields requiring fine work such as the manufacture of integrated circuit elements in order to achieve high integrity in ICs. Development of a lithography process capable of performing fine work, even of a size of 0.5 $\mu$m or smaller, in a stable manner is actively being undertaken.

However, it is difficult to produce such a minute pattern at high precision by conventional methods using visible light (wavelength 700–400 nm) or near ultraviolet light (wavelength 400–300 nm). Because of this, lithography processes using radiation with a short wavelength (wavelength 300 nm or less), capable of achieving a wider depth of focus, and effective for miniaturizing a fine design rule has been proposed.

Examples of such lithography processes using short wavelength radiation are processes using a deep ultraviolet light such as a KrF excimer laser (wavelength 248 nm), an ArF excimer laser (wavelength 193 nm), X-rays such as synchrotron radiation, and charged particle rays such as an electron beam. A chemically amplified resist has been proposed by International Business Machines(IBM) as a high resolution resist used for such short wavelength radiation. Development and improvement of the chemically amplified resist are actively being undertaken at present.

A chemically amplified resist contains a radiation sensitive acid generator which generates an acid on being exposed to radiation. A chemical reaction, such as a change in polarity, cleavage of a chemical bond, or a cross-linking reaction is caused to occur in the resist coating by the catalytic action of the acid produced. This causes the solubility of the irradiated parts in a developing solution to change, thereby allowing a pattern to be produced in the resist coating.

Given as examples of conventional chemically amplified resists which exhibit relatively excellent resist performance are a resin containing an alkali-soluble resin in which the groups exhibiting affinity with an alkali are protected by a t-butyl ester group or t-butoxy carbonyl group (Japanese Patent Publication No. 27660/1990); a resin containing an alkali-soluble resin in which the groups exhibiting affinity with an alkali are protected by a silyl group (Japanese Patent Publication No. 44290/1991); a resin containing a (meth) acrylic acid component (Japanese Patent Publication No. 39665/1992), a resin containing an alkali-soluble resin in which the groups exhibiting affinity with an alkali are protected by a ketal group (Japanese Patent Application Laid-open No. 140666/1995); and a resin containing an alkali-soluble resin in which the groups exhibiting affinity with an alkali are protected by an acetal group (Japanese Patent Applications Laid-open No. 161436/1990 and No. 249682/1993).

However, it has been pointed out that all of these chemically amplified resists have peculiar problems which makes their commercial application difficult.

One serious problem is a situation where the line width of a resist pattern changes or the resist pattern is deformed into the form of a character "T" according to a post exposure delay (hereinafter abbreviated as "PED"), which is the period of time before the resist is baked (post baking) after irradiation.

In addition to these problems, there are problems such as fluctuation in resolution by PED, large dependency on the bake temperature, insufficient process stability, and the like. Further improvement in the overall characteristics of the chemically amplified resists is therefore strongly desired.

Among the above-described chemically amplified resists a positive tone resist containing a copolymer of hydroxystyrene and t-butyl acrylate as a resin component (hereinafter referred to as Type 1) and a positive tone resist containing a resin component with phenolic hydroxyl groups in poly(hydroxystyrene) protected with a ketal group or acetal group (hereinafter referred to as Type 2) are reported to have the above various problems only to a relatively small extent.

However, the Type 1 resist is easily affected by a standing wave because this resist contains a large amount of acrylic components having a small absorption coefficient at a wavelength of 248 nm, which gives rise to an impaired pattern configuration. The Type 1 resist also exhibits only poor resolution. The Type 2 resist, on the other hand, exhibits only poor heat resistance, giving rise to pattern deformation due to heat. In the situation where demand for miniaturization increases, these resists cannot satisfy all requirements, such as high resolution, excellent heat resistance, and the like, at the same time.

In view of this situation, the present invention has been completed as a result of detailed studies relating to resin components comprising chemically amplified resists. Specifically, an object of the present invention is to provide a radiation sensitive resin composition useful as a chemically amplified positive tone resist, which is sensitive to various types of radiation and which exhibits high resolution, superb capability of producing superior pattern forms, and excellent resistance to PED, higher process stability, is affected by a standing wave only to a minimum extent, and possesses prominent heat resistance.

SUMMARY OF THE INVENTION

This object can be achieved in the present invention by a radiation sensitive resin composition comprising, (A) a copolymer which becomes soluble in an alkali developing solution by the action of an acid, the copolymer containing a recurring unit (I) having a structure which is decomposed by the action of an acid and increases the solubility in an alkaline developing solution and a recurring unit(II) obtained from a compound having at least two (meth) acryloyl groups in the molecule by the cleavage of the carbon-carbon double bond, and (B) a photoacid generator which produces an acid on being irradiated.

Other objects, features and advantages of the invention will hereinafter become more readily apparent from the following description.

DETAILED DESCRIPTION OF THE INVENTION AND PREFERRED EMBODIMENTS

The present invention will now be explained in more detail.

Copolymer (A)

The copolymer (A) which is used in the present invention contains the above-mentioned recurring units (I) and (II). This copolymer becomes soluble in an alkaline developing solution by the action of an acid.

The recurring unit (I) in the copolymer (A) has a structure capable of being decomposed by the action of an acid and producing an acidic functional group such as a carboxyl group or a phenolic hydroxyl group, thereby increasing the solubility of the copolymer (A) in the alkaline developing solution.

Among the monomers which form the recurring unit (I) (hereinafter called "monomer (I)"), given as examples of the monomers having a structure producing a carboxyl group by decomposition which gives the recurring unit (I) are (meth) acrylates protected by an acid decomposable ester group, such as t-butyl (meth)acrylate, tetrahydropyranyl (meth) acrylate, 2-methoxyethyl (meth)acrylate, 2-ethoxyethyl (meth)acrylate, 2-t-butoxycarbonylethyl (meth)acrylate, 2-benzyloxycarbonylethyl (meth)acrylate, 2-phenoxycarbonyl-ethyl (meth)acrylate, 2-cyclohexyloxycarbonylethyl (meth)acrylate, 2-isobornyloxycarbonylethyl (meth)acrylate, and 2-tricyclodecanyloxycarbonylethyl (meth)acrylate; hydroxy (α-methyl)styrenes protected by an acid decomposable ester group, such as o-(t-butoxycarbonylmethoxy)styrene, m-(t-butoxycarbonylmethoxy)styrene, p-(t-butoxycarbonyl-methoxy)styrene, and α-methyl substituted isomers of these compounds.

Given as examples of the monomers having a structure producing a phenolic hydroxyl group by decomposition are hydroxy (α-methyl)styrenes protected by an acetal group, such as p-(1-methoxyethoxy)styrene, p-(1-ethoxyethoxy) styrene, p-(1-n-propoxyethoxy)styrene, p-(1-i-propoxyethoxy)styrene, p-(1-cyclohexyloxyethoxy)styrene, p-(1-isobornyloxyethoxy) styrene, and α-methyl substituted isomers of these compounds; p-acetoxystyrene, t-butoxycarbonyloxystyrene, t-butoxystyrene, and α-methyl substituted isomers of these compounds.

Of these monomer (I) compounds, particularly preferred are t-butyl (meth) acrylate, tetrahydropyranyl (meth) acrylate, 2-cyclohexyloxycarbonylethyl (meth)acrylate, p-(1-ethoxy-ethoxy)styrene, and the like.

thereby reducing the motions of polymer molecular chains, controlling heat deformation, and improving heat resistance. Moreover, because a branched structure is introduced into the copolymer (A) by the recurring unit (II) at the same time, it is possible to decrease the viscosity of the polymer solution in comparison with a linear polymer. This makes it possible for the copolymer (A) to have a higher molecular weight, which results in higher heat resistance and improved resolution as a resist.

Given as examples of the monomers which provide the recurring unit (II) (hereinafter called "monomer (II)") are esters of a compound having two or more hydroxyl groups in the molecule, such as a polyhydric alcohol, polyether diol, or polyester diol, and (meth) acrylic acid; addition compounds made from a compound having two or more epoxy groups in the molecule and (meth) acrylic acid, which is typified by an epoxy resin; and condensation products made from a compound having two or more amino groups in the molecule and (meth)acrylic acid.

Specific examples of the monomer (II) include ethylene glycol di(meth)acrylate, diethylene glycol di(meth)acrylate, triethylene glycol di(meth)acrylate, propylene glycol di(meth)acrylate, dipropylene glycol di(meth)acrylate, tripropylene glycol di(meth)acrylate, butanediol di(meth) acrylate, trimethylolpropane di(meth)acrylate, trimethylolpropane tri(meth)acrylate, pentaerythritol tri(meth)acrylate, pentaerythritol tetra(meth)acrylate, tricyclodecanedimethanol di(meth)acrylate, trimethylolpropane tri(meth)acrylate, N,N'-methylene-bis-(meth)acrylamide; polyalkylene glycol (derivative) di(meth)acrylates shown by the following formula (1),

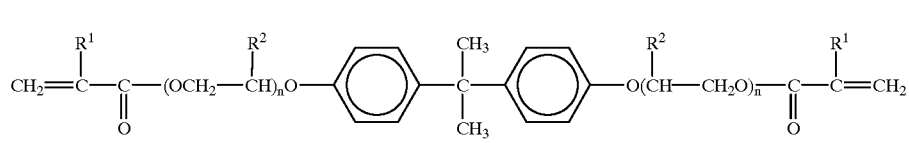

One of these recurring units (I) or two or more of them may be contained in the copolymer (A).

The recurring unit (I) is contained in the copolymer (A) in an amount usually of 10–70 wt %, preferably 10–60 wt %, and more preferably 15–55 wt %. If the content of the recurring unit (I) is less than 10 wt %, the resolution of the resist tends to decrease; if more than 70 wt %, on the other hand, the sensitivity as the resist and adhesion to the substrate tend to decrease.

The recurring unit (II) in the copolymer (A) can be obtained by cleavage of the carbon-carbon double bond in the compound which possesses two or more (meth)acryloyl groups in a molecule. The function of this unit is to introduce a moderate cross-linking structure into the copolymer (A), (wherein $R^1$ and $R^2$ individually represent a hydrogen atom or a methyl group, and n is an integer of 1–5), such as di (meth) acrylate of propyl glycol addition compound or ethylene glycol addition compound of bisphenol A; and epoxy (meth) acrylates, such as a (meth) acrylic acid addition compound to bisphenol A diglycidyl ether, which is shown by the following formula (2),

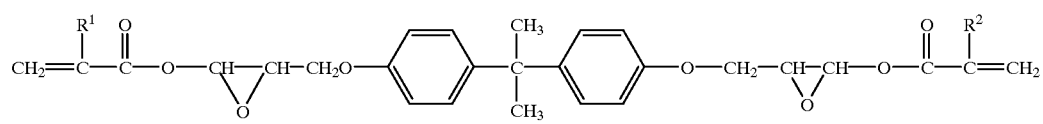

(wherein $R^1$ and $R^2$ are the same as defined above).

Of these compounds of the monomer (II), ethylene glycol di (meth) acrylate, tricyclodecanedimethanol di (meth) acrylate, and (meth) acrylic acid adduct to bisphenol A diglycidyl ether are particularly preferred One of these recurring units (II) or two or more of them may be contained in the copolymer (A).

The recurring unit (II) is contained in the copolymer (A) in an amount usually of 0.1–30 wt %, preferably 1–25 wt %, and more preferably 2–20 wt %. If the content of the recurring unit (II) is less than 0.1 wt %, the resolution of the resist tends to decrease; if more than 30 wt %, on the other hand, the solubility in the developing solution tends to decrease.

The copolymer (A) may contain other recurring units (hereinafter called recurring unit (III) ) than the recurring units (I) or (II).

Given as examples of the monomers which provide the recurring unit (III) (hereinafter called "monomer (III)") are aromatic vinyl compounds such as o-hydroxystyrene, m-hydroxystyrene, p-hydroxystyrene, o-iso-propenylphenol, m-iso-propenylphenol, p-iso-propenylphenol, styrene, α-methylstyrene, p-methylstyrene, p-chlorostyrene, and p-methoxystyrene; hetero atom-containing alicyclic vinyl compounds, such as N-vinylpyrrolidone and N-vinylcaprolactam; cyano group-containing vinyl compounds, such as (meth)acrylonitrile and cyanated vinylidene; (meth)acrylamides or derivatives thereof, such as (meth)acrylamide, N,N-dimethyl (meth) acrylamide, and N,N-dimethylol (meth)acrylamide; methyl (meth)acrylate, ethyl (meth)acrylate, n-propyl (meth) acrylate, i-propyl (meth)acrylate, 2-hydroxyethyl (meth) acrylate, 2-hydroxypropyl (meth)acrylate, 3-hydroxypropyl (meth)acrylate, phenyl (meth)acrylate, cyclohexyl (meth) acrylate, benzyl (meth)acrylate, isobornyl (meth)acrylate, and tricyclodecanyl (meth)acrylate.

Of these compounds of the monomer (III), particularly preferred are o-hydroxystyrene, m-hydroxystyrene, p-hydroxystyrene, o-iso-propenylphenol, m-iso-propenylphenol, p-iso-propenylphenol, styrene, and tricyclodecanyl (meth)acrylate. p-Hydroxystyrene and p-iso-propenylphenol are ideal compounds.

One of these recurring units (III) or two or more of them may be contained in the copolymer (A).

Although the content of the recurring unit (III) in the copolymer (A) differs according to the contents of the recurring units (I) and (II), a range usually of 0–80 wt %, preferably 10–70 wt %, and more preferably 15–65 wt %, for the total amount of the recurring units (I) to (III), is applicable. If the content of the recurring unit (III) is more than 80 wt %, the resolution of the resist tends to decrease.

The copolymer (A) can be prepared according to the following processes, for example: (a) a process of directly copolymerizing the monomer (I) and monomer (II), together with the monomer (III) which preferably contains p-hydroxystyrene and/or p-iso-propenylphenol; (b) a process comprising copolymerizing the monomer (II) with p-t-butoxystyrene and p-t-butoxy- α-methylstyrene, hydrolyzing the resulting copolymer under acidic conditions to obtain a copolymer of p-hydroxystyrene and/or p-iso-propenylphenol, and protecting, preferably, a part of the phenolic hydroxyl groups in this copolymer with a group decomposable by the action of an acid, such as 1-ethoxyethoxy group or t-butoxycarbonyloxy group; or (c) a process of copolymerizing p-acetoxystyrene and the monomer (II), optionally together with the monomer (I) other than p-acetoxystyrene, and hydrolyzing the resulting copolymer under basic conditions.

The polymerization reactions in the processes (a), (b), or (c) can be carried out using a polymerization initiator, molecular weight modifier, and the like which are known in the art.

Given as examples of the polymerization initiator are benzoyl peroxide, lauroyl paroxide, 2,2'-azobis-iso-butylonitrile, 4, 4'-azobis(4-cyanovalericacid), 2,2'-azobis-(4-methoxy-2,4-dimethylvaleronitrile), and the like. These polymerization initiators may be used either individually or in combinations of two or more.

Further, given as examples of the molecular weight modifiers are halogenated hydrocarbons such as carbon tetrachloride, chloroform, carbon tetrabromide; mercaptans such as n-hexylmercaptan, n-octylmercaptan, n-dodecyl-mercaptan, t-dodecylmercaptan, thioglycolic acid, and thiopropionic acid; xanthogens such as dimethylxanthogen disulfite and diisopropylxanthogen disulfite; terpinolene, α-methylstyrene dimer, and the like. These molecular weight modifiers may be used either individually or in combinations of two or more.

The weight average molecular weight of the copolymer (A) reduced to polystyrene (hereinafter abbreviated "Mw") measured by gel permeation chromatography (GPC) is usually from 10,000 to 500,000, preferably from 15,000 to 200,000, and more preferably from 20,000 to 150,000. If the Mw of the copolymer (A) is less than 10,000, sensitivity and heat resistance of the copolymer as a resist tend to be poor; if more than 500,000, on the other hand, the solubility of the copolymer (A) in a developing solution tends to decrease.

The copolymer (A) may be used either individually or two or more copolymers (A) may be used in combinations.

(B) Photoacid Generators (B)

The photoacid generators used in the present invention are compounds generating an acid by exposure to radiation (hereinafter referred to as irradiation).

Typical photoacid generators (B) include (a) onium salt compounds, (b) sulfone compounds, (c) sulfonate compounds, (d) sulfonimide compounds, and (e) diazomethane compounds. Specific examples of these compounds are as follows.

(a) Onium salt compounds

Iodonium compounds, sulfonium compounds, phosphonium compounds, diazonium compounds, ammonium compounds, pyridinium compounds, and the like are given as the onium salt compounds.

Given as specific onium salt compounds are diphenyliodonium trifluoromethanesulfonate, diphenyliodonium pyrenesulfonate, diphenyliodonium dodecylbenzenesulfonate, triphenylsulfonium trifluoromethanesulfonate, diphenyliodonium hexafluoroantimonate, triphenylsulfonium naphthalenesulfonate, triphenylsulfonium camphorsulfonate, (hydroxydiphenyl) benzylmethylsulfonium toluenesulfonate, and the like.

(b) Sulfone compounds

As typical examples of the sulfone compounds, β-ketosulfone, β-sulfonylsulfone, and α-diazo compounds of these are given.

Specific examples include phenacylphenyl sulfone, mesitylphenacyl sulfone, bis(phenylsulfonyl)methane, 4-trisphenacyl sulfone, and the like.

(c) Sulfonate compounds

Alkylsulfonates, haloalkylsulfonates, arylsulfonates, and iminosulfonates are given as examples.

Specific examples of the sulfonate compounds include benzointosylate, pyrogallol tristrifluoromethanesulfonate, pyrogallol trimethanesulfonate, nitrobenzyl-9,10-diethoxy-anthracene-2-sulfonate, α-methylolbenzointosylate, α-methylolbenzoinoctanesulfonate, α-methylolbenzoin trifluoromethanesulfonate, α-methylolbenzoindodecyl-sulfonate.

(d) Sulfonimide compounds

As sulfonimide compounds, the compounds represented by the following formula (3) can be given.

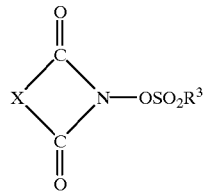
(3)

wherein X is a divalent group such as an alkylene group, arylene group, or alkoxylene group; $R^3$ indicates a monovalent group such as an alkyl group, aryl group, halogen-substituted alkyl group, or halogen-substituted aryl group.

The following compounds are given as specific examples of the sulfonimide compounds: N-(trifluoromethylsulfonyloxy)-succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hepto-5-ene-2,3-dicarboximide, N-(trifluoromethylsulfonyloxy)-7-oxabicyclo[2.2.1]hepto-5-ene-2,3-dicarboximide, N-(trifluoromethylsulfonyloxy)bicyclo[2.2.1]heptane-5,6-oxy-2,3-dicarboximide, N-(trifluoromethylsulfonyloxy)naphthylimide, N-(camphorsulfonyloxy)succinimide, N-(camphorsulfonyloxy)phthalimide, N-(camphorsulfonyloxy)-diphenylmaleimide, N-(camphorsulfonyloxy)bicyclo[2.2.1]-hepto-5-ene-2,3-dicarboximide, N-(camphorsulfonyloxy)-7-oxabicyclo[2.2.1]hepto-5-ene-2,3-dicarboximide, N-(camphorsulfonyloxy)bicyclo[2.2.1]heptane-5,6-oxy-2,3-dicarboximide, N-(camphorsulfonyloxy)naphthylimide, N-(camphorsulfonyloxy)naphthyldicarboximide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo-[2.2.1]-hepto-5-ene-2,3-dicarboximide, N-(4-methylphenylsulfonyloxy)-7-oxabicyclo[2.2.1]hepto-5-ene-2,3-dicarboximide, N-(4-methylphenylsulfonyloxy)bicyclo[2.2.1]-heptane-5,6-oxy-2,3-dicarboximide, N-(4-methylphenylsulfonyloxy) naphthylimide, N-(2-trifluoromethylphenylsulfonyloxy) succinimide, N-(2-trifluoromethylphenylsulfonyloxy) phthalimide, N-(2-trifluoromethylphenylsulfonyloxy) diphenylmaleimide, N-(2-trifluoromethylphenylsulfonyloxy)bicyclo[2.2.1]hepto-5-ene-2,3-dicarboximide, N-(2-trifluoromethylphenylsulfonyloxy)-7-oxabicyclo[2.2.1]hepto-5-ene-2,3-dicarboximide, N-(2-trifluoromethylphenylsulfonyloxy)-bicyclo[2.2.1]heptane-5,6-oxy-2,3-dicarboximide, N-(2-trifluoromethylphenylsulfonyloxy) naphthylimide, N-(4-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)bicyclo[2.2.1]hepto-5-ene-2,3-dicarboximide, N-(trifluoromethylsulfonyloxy)-7-oxabicyclo[2.2.1]hepto-5-ene-2,3-dicarboximide, N-(4-fluorophenylsulfonyloxy)bicyclo[2.2.1]heptane-5,6-oxy-2,3-dicarboximide, and N-(4-fluorophenylsulfonyloxy)-naphthyldicarboximide.

(e) Diazomethane compounds

As diazomethane compounds, the compounds represented by the following formula (4) can be given.

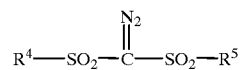
(4)

wherein $R^4$ and $R^5$ individually represent a monovalent group such as an alkyl group, aryl group, halogen-substituted alkyl group, or halogen-substituted aryl group.

Specific examples of the diazomethane compounds include bis(trifluoromethylsulfonyl)diazomethane, bis (cyclohexylsulfonyl)diazomethane, bis(phenylsulfonyl)-diazomethane, bis(p-toluenesulfonyl)diazomethane, methylsulfonyl-p-toluenesulfonyldiazomethane, 1-cyclohexyl-sulfonyl-1-(1,1-dimethylethylsulfonyl) diazomethane, and bis (11-dimethylethylsulfonyl) diazomethane.

Of these photoacid generators (B), (a) onium salt compounds, (c) sulfonate compounds, (d) sulfonimide compounds, and (e) diazomethane compounds are preferred. Particularly preferred photoacid generators are triphenylsulfonium trifluoromethanesulfonate, α-methylolbenzointosylate, α-methylolbenzoinoctanesulfonate, α-methylolbenzoin-trifluoromethanesulfonate, α-methylolbenzoin dodecylsulfonate, pyrogallol trimethanesulfonate, N-(trifluoromethylsulfonyloxy)bicyclo[2.2.1]hepto-5-ene-2,3-dicarboximide, N-(camphorsulfonyloxy)bicyclo[2.2.1]-hepto-5-ene-2,3-dicarboximide, N-(camphorsulfonyloxy) naphthyl-dicarboximide, and bis(cyclohexylsulfonyl) diazomethane.

The photoacid generators (B) may be used either individually or in combinations of two or more in the present invention.

The amount of the photoacid generators (B) used in the composition of the present invention is in the range of 1–20 parts by weight, preferably 1–10 parts by weight, for 100 parts by weight of the copolymer (A). If the amount of the photoacid generator (B) is less than 1 part by weight, the chemical reaction by the catalytic action of the acid generated by irradiation may proceed only insufficiently; if more than 20 parts by weight, the coating surfaces may become uneven when the composition is applied and development residues (scum) may be produced during development.

(C) Acid Diffusion Control Agent

It is desirable for the composition of the present invention to contain (C) an acid diffusion control agent which controls diffusion of the acid generated by irradiation of the photoacid generator (B) in resist films, thereby controlling undesired chemical reactions in the area which has not been exposed to radiation. Use of such an acid diffusion control agent ensures improved storage stability of the composition, increases resolution of the resist, and prevents line width in resist patterns from being changed by PED. Thus, the acid diffusion control agent greatly improves process stability.

A nitrogen-containing organic compound of which the basic properties do not change due to exposure to radiation or baking are preferably used as such an acid diffusion control agent. Specific examples of such a compound include the compounds of the formula $R^6R^7R^8N$ (wherein, $R^6, R^7$, and $R^8$ individually represent a hydrogen atom, alkyl group, aryl group, or aralkyl group) (hereinafter called "nitrogen-containing compound (α)"), diamino compounds having two nitrogen atoms in the molecule (hereinafter called "nitrogen-containing compound (β)"), polymers containing three or more nitrogen atoms (hereinafter called "nitrogen-containing compound (γ)"), amide group-containing compounds, urea compounds, nitrogen-containing heterocyclic compounds, and the like.

Given as examples of the nitrogen-containing compound (α) are monoalkylamines, such as n-hexylamine, n-heptylamine, n-octylamine, n-nonylamine, and n-decylamine; dialkylamines, such as di-n-butylamine, di-n-pentylamine, di-n-hexylamine, di-n-heptylamine, di-n-octylamine, di-n-nonylamine, and di-n-decylamine; trialkylamines, such as triethylamine, tri-n-propylamine, tri-n-butylamine, tri-n-pentylamine, tri-n-hexylamine, tri-n-heptylamine, tri-n-octylamine, tri-n-nonylamine, and tri-n-decylamine; and aromatic amines, such as aniline, N-methylaniline, N,N-dimethylaniline, 2-methylaniline, 3-methylaniline, 4-methylaniline, 4-nitroaniline, diphenylamine, triphenylamine, and naphthylamine.

Examples of the nitrogen-containing compound (β) include ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxydiphenyl)propane, 2-(4-aminophenyl)-2-(4-hydroxydiphenyl)propane, 1,4-bis[1-(4-aminophenyl)-1-methylethyl]benzene, and 1,3-bis[1-(4-aminophenyl)-1-methylethyl]benzene.

Examples of the nitrogen-containing compound (γ) include polymers such as polyethylene imine, polyethylene allyl amine, dimethylaminoethyl acrylamide, and the like.

Examples of the amide group-containing compound include formamide, N-methylformamide, N,N-dimethylformamide, acetamide, N-methylacetamide, N,N-dimethylacetamide, propionamide, benzamide, pyrolidone, N-methylpyrolidone, and the like.

The urea compounds include, for example, urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include imidazoles, such as imidazole, benzimidazole, 4-methylimidazole, 4-methyl-2-phenylimidazole; pyridines, such as pyridine, 2-methylpyridine, 4-methylpyridine, 2-ethylpyridine, 4-ethylpyridine, 2-phenylpyridine, 4-phenylpyridine, N-methyl-4-phenylpyridine, nicotine, nicotinic acid, nicotinic acid amide, quinoline, 8-oxyquinoline, and acridine; pyrazine, pyrazole, pyridazine, quinoxaline, purine, pyrrolidine, piperidine, morpholine, 4-methylmorpholine, piperazine, 1,4-dimethylpiperazine, and 1,4-diazabicyclo[2.2.2]octane.

Among these nitrogen-containing organic compounds, the nitrogen-containing compounds (a) and nitrogen-containing heterocyclic compounds are preferred. Among the nitrogen-containing compounds (a), trialkylamines are particularly preferred. Among the nitrogen-containing heterocyclic compounds, pyridines are particularly preferred.

These acid diffusion control agents may be used either individually or in combinations of two or more in the present invention.

The amount of the acid diffusion control agent (C) used is usually 15 parts by weight or less, preferably 0.001–10 parts by weight, and more preferably 0.005–5 parts by weight, for 100 parts by weight of the amount of copolymer (A). If more than 15 part by weights, sensitivity as a resist and developing performance in the irradiated parts tends to decrease; if less than 0.001 part by weight, there may be a case where the pattern configuration and dimensional accuracy as a resist are impaired according to the process conditions.

Alkali-soluble Resin

In the present invention, an alkali-soluble resin can be added in addition to the copolymer (A) as required.

This alkali-soluble resin is a resin soluble in the alkali developing solution due to its possession of at least one acidic functional group exhibiting affinity with an alkali developing solution, such as a carboxyl group or phenolic hydroxyl group. Use of such an alkali-soluble resin makes it easy to control the rate of dissolution of the resist film formed from the radiation sensitive resin composition of the present invention in an alkali developing solution, thereby increasing its developing performance.

There are no limitations to the alkali-soluble resin used in the present invention, inasmuch as such a resin is soluble in an alkali developing solution. Specific examples include hydroxy styrenes, iso-propenylphenols, vinylbenzoic acids, carboxymethyl styrenes, carboxymethoxy styrenes, addition-polymers containing at least one recurring unit produced by cleavage of polymerizable double bonds in ethylenically unsaturation monomers which contain an acidic functional group, such as (meth) acrylic acid, crotonic acid, maleic acid, fumaric acid, itaconic acid, citraconic acid, mesaconic acid, or cinnamic acid; and polycondensation resins, typified by novolak resin, which contains at least one condensation recurring unit possessing an acidic functional group.

The alkali-soluble resin comprising the above-described addition polymer may consist only of the recurring unit produced by cleavage of the polymerizable double bond of ethylenically unsaturated monomers or comprise one or more other recurring units.

Given as examples of such other recurring units are the recurring units produced by cleavage of polymerizable double bonds of the compounds such as styrene, α-methyl styrene, vinyl toluenes, maleicanhydride, (meth) acrylonitrile, crotonitrile, maleinitrile, fumarnitrile, mesaconitrile, citraconitrile, itaconitrile, (meth)acrylamide, crotonamide, maleinamide, fumaramide, mesaconamide, citraconamide, itaconamide, vinyl anilines, vinyl pyridines, N-vinyl-ε-caprolactam, N-vinyl pyrrolidone, and N-vinyl imidazole.

Among these addition polymers, a copolymer of poly (hydroxystyrene) and iso-propenyl phenol is particularly preferred due to its superior transmissibity of radiation when made into a resist film, and its excellent dry-etching resistance.

The alkali-soluble resin containing the above-described polycondensation resins may either consist only of the recurring unit containing an acidic functional group or may optionally comprise one or more other recurring units.

Such a polycondensation resin can be manufactured from at least one phenolic compound and at least one aldehyde compound, and optionally other monomers which may polymerize by condensation and produce other recurring units, by (co)polymerizing these monomers in the presence of an acidic catalyst or a basic catalyst in an aqueous medium or in a mixture of water and a hydrophilic solvent.

Given as examples of the phenolic compounds used here are o-cresol, m-cresol, p-cresol, 2,3-xylenol, 2,4-xylenol, 2,5-xylenol, 3,4-xylenol, 3,5-xylenol, 2,3,5- trimethylphenol, 3,4,5-trimethylphenol, and the like. The aldehyde compounds which can be used in the preparation of the polycondensation resin include formaldehyde, trioxane, paraformaldehyde, benzaldehyde, acetaldehyde, propylaldehyde, phenyl acetaldehyde, and the like.

The Mw of the alkali-soluble resin is usually from 1,000 to 100,000, preferably from 3,000 to 50,000, and particularly preferably from 3,000 to 30,000. If the Mw of the alkali-soluble resin is less than 1,000, resolution as a resist tends to decrease; if more than 100,000, the resist solution made from the composition of the present invention has a high viscosity and may produce a coating of uneven thickness when applied to a substrate.

The above-described various alkali-soluble resins may be used either individually or in combinations of two or more.

The amount of alkali-soluble resin used in the composition of the present invention is usually 200 parts by weight or less for 100 parts by weight of copolymer (A). If more than 200 parts by weight, resolution as a resist tends to decrease.

Additives

Various additives such as a surfactant and photosensitizer can be added to the radiation sensitive resin composition of the present invention as required.

The surfactant improves coatability of the composition and promote developing performance of the resist.

Given as examples of such a surfactant are polyoxyethylene lauryl ether, polyoxyethylene stearyl ether, polyoxyethylene oleyl ether, polyoxyethylene octylphenyl ether, polyoxyethylene nonyl phenyl ether, polyethylene glycol dilaurate, polyethylene glycol distearate, and the like.

The amount of surfactants to be added to the composition of the present invention is usually 2 parts by weight or less per 100 parts by weight of the amount of copolymer (A).

The photosensitizer absorbs radiation energy and transmits the energy to the photoacid generator (B), thereby increasing the amount of the acid generated by irradiation. Thus, the photosensitizer increases apparent sensitivity of the resist.

Examples of preferable photosensitizers are benzophenones, Rose Bengales, anthracenes, acetophenones, pyrenes, phenothiazines, and the like.

The amount of the photosensitizers added to the composition of the present invention is usually 50 parts by weight or less per 100 parts by weight of the amount of the copolymer (A).

Moreover, a dye and/or a pigment may be incorporated to make latent images of irradiated parts visible, whereby the effect of halation during exposure to radiation can be mitigated. In addition, an adhesive may be added to improve the adhesion properties of the composition with substrates.

Other additives which may be used include a halation preventive, shape improving agent, preservative, stabilizer, anti-foaming agent, and the like.

Solvent

When used, the radiation sensitive resin composition of the present invention is prepared as a composition solution with a concentration of 3–50 wt % (as total solid component), and preferably 5–40 wt %, by being homogeneously dissolved in a solvent and filtered through a filter with a pore size of about 0.2 $\mu$m.

Given as examples of the solvent used in the preparation of the composition solution are ethylene glycol monoalkyl ether acetates such as ethylene glycol monomethyl ether acetate, ethylene glycol monoethyl ether acetate, ethylene glycol mono-n-propyl ether acetate, and ethylene glycol mono-n-butyl ether acetate; propylene glycol monoalkyl ethers such as propylene glycol monomethyl ether, propylene glycol monoethyl ether, propylene glycol mono-n-propyl ether, and propylene glycol mono-n-butyl ether; propylene glycol dialkyl ethers such as propylene glycol dimethyl ether, propylene glycol diethyl ether, propylene glycol di-n-propyl ether, and propylene glycol di-n-butyl ether; propylene glycol monoalkyl ether acetates such as propylene glycol monomethyl ether acetate, propylene glycol monoethyl ether acetate, propylene glycol mono-n-propyl ether acetate, and propylene glycol mono-n-butyl ether acetate; aliphatic carboxylic acid esters such as lactate (e.g. methyl lactate, ethyl lactate, n-propyl lactate), acetates (e.g. ethyl acetate, i-propyl acetate, n-propyl acetate, 1-propyl acetate, n-butyl acetate, i-butyl acetate, n-amyl acetate, i-amyl acetate), propionates (e.g. i-propyl propionate, n-butyl propionate, i-butyl propionate); other esters such as methyl 3-methoxypropionate, ethyl 3-methoxypropionate, methyl 3-ethoxypropionate, ethyl 3-ethoxypropionate, methyl pyruvate, and ethyl pyruvate; aromatic hydrocarbons such as toluene and xylene; ketones such as 2-heptanone, 3-heptanone, 4-heptanone, and cyclohexanone; amides such as N,N-dimethylformamide, N-methylacetamide, N,N-dimethylacetamide, and N-methylpyrrolidone; and lactones such as y-butyrolactone. These solvents may be used either individually or in combinations of two or more.

Preparation of Resist Pattern

To prepare a resist pattern using the radiation sensitive resin composition of the present invention, the composition solution prepared as described above is applied to a substrate such as a silicon wafer or aluminum-coated silicon wafer, to form a resist coating by means of rotational coating, cast coating, or roll coating. The resist coating is then treated with heat (hereinafter called "pre-bake") as required, and irradiated to form a desired pattern through a mask pattern. Radiation used here is selected according to the type of the photoacid generator (B) used. Specific examples are ultraviolet rays such as an i-line (wavelength: 365 nm), deep ultraviolet rays such as an ArF excimer laser (wavelength: 193 nm) and a KrF excimer laser (wavelength: 248 nm), X-rays such as synchrotron radiation, and charged particle rays such as an electron beam. Irradiation conditions such as the exposure dose of irradiation are appropriately determined according to the kind of the resin composition, kind of additives, and the like.

After exposure to radiation, the coatings are preferably post-baked to increase the apparent sensitivity of the resist. Although the heating conditions are varied according to the type of the resin composition and the kind of additive used, the resist is usually heated at 30–200° C., preferably 40–150° C.

Then, the resist coating is developed with an alkaline developer for forming a prescribed pattern usually at a temperature of 10–50° C. for 30–200 seconds.

An alkaline developing solution in which one or more alkaline compound is dissolved to a concentration of 1–10% by weight, preferably 1–5% by weight, is used as the alkaline developer. Given as examples of alkaline compounds which can be used here are mono-, di-, or tri-alkyl amines, mono-, di-, or tri-alkanol amines, heterocyclic amines, tetra-alkylammonium hydroxides, cholines, 1,8- diazabicyclo-[5.4.0]-7-undecene, and 1,5-diazabicyclo-[4.3.0]-5-nonene.

Further, suitable amounts of water-soluble organic solvents, such as methanol and ethanol, and surfactants may be added to the aqueous alkaline solution used as the developer.

The developed products are normally washed with water after development using these alkaline developers.

Furthermore, it is possible to provide a protective coating over the resist coating to prevent the effect of basic impurities contained in the environmental atmosphere in which resist patterns are produced.

Japanese Patent Application No. 316888/1996 is hereby incorporated by reference.

Other features of the invention will become apparent in the course of the following description of the exemplary embodiments which are given for illustration of the invention and are not intended to be limiting thereof.

EXAMPLES

In the examples and comparative examples below measurement of the Mw of polymers and evaluation of various characteristics of the resists were carried out according to the following methods.

Mw:

The Mw was measured by gel permeation chromatography using a monodispersed polystyrene as a standard, wherein GPC columns (two $G2000H_{XL}$ columns, one $G3000H_{XL}$ column, and one $G4000H_{XL}$ column, all trademarks, manufactured by Tosoh Corp.) were used under the conditions of a flow rate of 1.0 ml/minute, a column temperature of 40° C., and using tetrahydrofuran as an eluant.

Sensitivity:

The optimum exposure sensitivity was determined taking the irradiation dose required for forming a pair of line-and-space patterns 1L1S with a line width of 0.26 μm as an optimum dose.

Resolution:

The minimum size (μm) of resist pattern produced when exposed to light with an optimum exposure dose was taken as the resolution.

Pattern configuration:

A pattern configuration with an almost rectangular cross section at 1L1S with a line width of 0.26 μm, for which the effect of standing waves can be neglected, was judged to be "Good".

Heat resistance:

A pattern configuration with a square of 20 μm×20 μm was formed on a substrate by development and drying. The heat resistance was evaluated by measuring the temperature (°C.) below which the pattern configuration did not change

Synthesis of Copolymer (A)

Synthetic Example 1

23 g of t-butyl acrylate, 4 g of tricyclodecanedimethanol diacrylate, 27 g of p-iso-propenyl phenol, and 11 g of tricyclodecanyl acrylate were mixed with 78 g of propylene glycol monomethyl ether acetate to obtain a homogeneous solution. Nitrogen gas was bubbled through this solution for 30 minutes, followed by the addition of 3 g of 2,2'-azobis-iso-butylonitrile and 2 g of t-dodecylmercaptan. The mixture was polymerized at 70° C. for 24 hours while bubbling nitrogen gas. After polymerization, the reaction mixture was mixed with a large amount of hexane to solidify the copolymer which was produced. The copolymer was dissolved in dioxane and solidified again by the addition of hexane. This operation was repeated several times to remove unreacted monomers. The residue was dried at 50° C. for 24 hours under vacuum to obtain a white copolymer.

The copolymer thus obtained had an Mw of 101,000. As a result of $^{13}$C-NMR measurement, this copolymer was confirmed to have a monomer ratio by weight of t-butyl acrylate: tricyclodecanedimethanol diacrylate: p-iso-propenylphenol: tricyclodecanyl acrylate of 35:6:42:17. This copolymer is hereinafter designated as copolymer (A-1).

Synthetic Example 2

A copolymer was prepared in the same manner as in Synthetic Example 1, except 29 g of 2-cyclohexyloxycarbonyl ethyl acrylate, 2 g of tricyclodecanedimethanol diacrylate, and 19 g of p-iso-propenylphenol were used. The copolymer obtained had an Mw of 85,000 and a monomer ratio by weight for 2-cyclohexyloxycarbonyl ethyl acrylate: tricyclodecanedimethanol diacrylate:p-iso-propenylphenol of 58:4:38. This copolymer is hereinafter designated as copolymer (A-2).

Synthetic Example 3

A copolymer was prepared in the same manner as in Synthetic Example 1, except 19 g of t-butyl acrylate, 2 g of ethylene glycol diacrylate, 19 g of p-iso-propenylphenol, and 10 g of benzyl acrylate were used. The copolymer obtained had an Mw of 63,000 and a monomer ratio by weight for t-butyl acrylate: ethylene glycol diacrylate:p-iso-propenylphenol:benzyl acrylate of 38:4:38:20. This copolymer is hereinafter designated as copolymer (A-3).

Synthetic Example 4

15 g of t-butyl acrylate, 2 g of tricyclodecanedimethanol diacrylate, 30 g of p-acetoxystyrene, and 1 g of t-dodecylmercaptan were mixed with 200 g of dioxane to obtain a homogeneous solution. Nitrogen gas was bubbled through this solution for 30 minutes, followed by addition of 2 g of 2,2'-azobis-iso-butylonitrile. Polymerization was carried out at 70° C. for 7 hours while bubbling nitrogen gas through the mixture. After polymerization, the reaction mixture was mixed with a large amount of hexane to solidify the copolymer which was produced. The copolymer was dissolved in dioxane and solidified again by the addition of hexane. This operation was repeated several times to remove unreacted monomers. The residue was dried under vacuum at 50° C. for 24 hours to obtain a white copolymer.

Next, 24 g of this copolymer was mixed with 240 g of methanol, 24 g of triethylamine, and 5 g of water, and the mixture was heated for 8 hours while refluxing to hydrolyze the copolymer. After the reaction, the reaction mixture was charged into an aqueous solution of 1 wt % of oxalic acid to solidify the copolymer. The copolymer was washed with water and dried at 50° C. for 24 hours under vacuum to obtain a white copolymer.

The copolymer thus obtained had an Mw of 40,000. As a result of $^{13}$C-NMR measurement and $^{1}$H-NMR measurement, this copolymer was confirmed to have a monomer ratio by weight of t-butyl acrylate: tricyclodecanedimethanol diacrylate: p-hydroxystyrene of 38:5:57. This copolymer is hereinafter designated as copolymer (A-4).

Synthetic Example 5

12 g of t-butyl acrylate, 12 g of tricyclodecanedimethanol diacrylate, and 197 g of p-acetoxystyrene were mixed with 265 g of propylene glycol monomethyl ether to obtain a homogeneous solution. Nitrogen gas was bubbled through this solution for 30 minutes, followed by the addition of 9 g of 2,2'-azobis-iso-butylonitrile and 6 g of t-dodecylmercaptan. The mixture was polymerized at 70° C. for 24 hours while bubbling nitrogen gas. After polymerization, the reaction mixture was mixed with a large amount of hexane to solidify the copolymer which was produced. The copolymer was dissolved in acetone and solidified again by the addition of hexane. This operation was repeated several times to remove unreacted monomers. The residue was dried under vacuum at 50° C. for 24 hours to obtain a white copolymer.

Next, 50 g of this copolymer was mixed with 500 g of methanol, 50 g of triethylamine, and 10 g of water, and the mixture was heated for 8 hours while refluxing to hydrolyze the copolymer. After the reaction, the reaction mixture was added to an aqueous solution of 1 wt % of oxalic acid to solidify the copolymer. The copolymer was washed with water and dried at 50° C. for 24 hours under vacuum to obtain a white copolymer.

Then, 24 g of this copolymer was dissolved in 100 g of dioxane, and nitrogen gas was bubbled through the solution for 30 minutes. 4 g of ethyl vinyl ether and 0.4 g of pyridinium p-toluenesulfonate, as a catalyst, were added, and an acetalization reaction was carried out for 12 hours. After the reaction, the reaction mixture was added dropwise to 1 wt % aqueous ammonia solution to solidify the resulting product. The solid was washed with water and dried at 50° C. for 24 hours under vacuum to obtain a white copolymer.

The copolymer thus obtained had an Mw of 45,000. As a result of $^{13}$C-NMR measurement and $^1$H-NMR mesurement, this copolymer was confirmed to have a monomer ratio by weight of t-butyl acrylate: tricyclodecanedimethanol diacrylate:p-hydroxystyrene:p-(1-ethoxyethoxy)styrene of 7:6:57:30. This copolymer is hereinafter designated as copolymer (A-5).

Synthetic Example 6

A copolymer was prepared in the same manner as in Synthetic Example 1, except that 15 g of tetrahydropyranyl methacrylate, 5 g of acrylic acid adduct to bisphenol A diglycidyl ether (Epoxy Ester 3000A, trademark manufactured by Kyoeisha Chemical Co., Ltd.), and 30 g of tricyclodecanyl acrylate were used. The copolymer obtained had an Mw of 110,000 and a monomer ratio by weight for tetrahydropyranyl methacrylate:acrylic acid adduct to bisphenol A diglycidyl ether:tricyclodecanyl acrylate of 30:10:60. This copolymer is hereinafter designated as copolymer (A-6).

Synthetic Example 7

30 of g p-acetoxystyrene, 20 g of t-butyl acrylate, and 1 g of t-dodecylmercaptan were mixed with 200 g of dioxane to obtain a homogeneous solution. Nitrogen gas was bubbled through this solution for 30 minutes, followed by addition of 6 g of 2,2'-azobis(4-methoxy-2,4-dimethylvaleronitrile). Polymerization was carried out at 70° C. for 7 hours while bubbling nitrogen gas through the mixture. After polymerization, the reaction mixture was mixed with a large amount of hexane to solidify the copolymer which was produced. The copolymer was dissolved in dioxane and solidified again by the addition of hexane. This operation was repeated several times to remove unreacted monomers. The residue was dried under vacuum at 50° C. for 24 hours to obtain a white copolymer.

Next, 24 g of this copolymer was mixed with 240 g of methanol, 24 g of triethylamine, and 5 g of water, and the mixture was heated for 8 hours while refluxing to hydrolyze the copolymer. After the reaction, the reaction mixture was charged into an aqueous solution of 1 wt % of oxalic acid to solidify the copolymer. The copolymer was washed with water and dried at 50° C. for 24 hours under vacuum to obtain a white copolymer.

The copolymer thus obtained had an Mw of 13,000. As a result of elementary analysis, this copolymer was confirmed to have a monomer ratio by weight of p-hydroxystyrene:t-butyl acrylate of 56:44. This copolymer is hereinafter designated as copolymer (a-1).

Synthetic Example 8

18 g of t-butyl acrylate and 197 g p-acetoxystyrene were mixed with 265 g of propylene glycol monomethyl ether to obtain a homogeneous solution. Nitrogen gas was bubbled through this solution for 30 minutes, followed by addition of 9 g of 2,2'-azobis-iso-butylonitrile. Polymerization was carried out at 70° C. for 24 hours while bubbling nitrogen gas through the mixture. After polymerization, the reaction mixture was mixed with a large amount of hexane to solidify the copolymer which was produced. The copolymer was dissolved in acetone and solidified again by the addition of hexane. This operation was repeated several times to remove unreacted monomers. The residue was dried under vacuum at 50° C. for 24 hours to obtain a white copolymer.

Next, 50 g of this copolymer was mixed with 500 g of methanol, 50 g of triethylamine, and 10 g of water, and the mixture was heated for 8 hours while refluxing to hydrolyze the copolymer. After the reaction, the reaction mixture was charged into an aqueous solution of 1 wt % of oxalic acid to solidify the copolymer. The copolymer was washed with water and dried at 50° C. for 24 hours under vacuum to obtain a white copolymer.

Then, 24 g of this copolymer was dissolved in 100 g of dioxane, and nitrogen gas was bubbled through the solution for 30 minutes. 4 g of ethyl vinyl ether and 0.4 g of pyridinium p-toluenesulfonate, as a catalyst, were added, and an acetalization reaction was carried out for 12 hours. After the reaction, the reaction mixture was added dropwise to 1 wt % aqueous ammonia solution to solidify the resulting product. The solid was washed with water and dried at 50° C. for 24 hours under vacuum to obtain a white copolymer.

The copolymer thus obtained had an Mw of 20,000 As a result of $^{13}$C-NMR measurement and $^1$H-NMR measurement, this copolymer was confirmed to have a monomer ratio by weight of t-butyl acrylate:p-hydroxystyrene:p- (1-ethoxyethoxy) styrene of 9:60:31. This copolymer is hereinafter designated as copolymer (a-2).

Examples 1–6 and Comparative Examples 1–2

The components of the following formulation were mixed to obtain a homogeneous solution. The solution was filtered through a membrane filter with a pore size of 0.2 μm to prepare a composition solution.

| Formulation (parts by weight) | |
| --- | --- |
| Copolymer | 100 |
| Triphenylsulfonium trifluoromethanesulfonate (Photoacid generator) | 2 |
| Tri-n-butylamine (Acid diffusion control agent) | 0.1 |
| Methyl 3-methoxypropionate (solvent) | 400 |

Each composition solution was spin coated onto a silicon wafer. The silicon wafer was prebaked for 120 seconds at the temperature shown in Table 1 to obtain a resist coating with a thickness 0.7 μm.

The resist was irradiated with a KrF excimer laser using a KrF excimer laser stepper (NSR-2005 EX8A, trademark manufactured by Nicon Co., Ltd.), followed by postbaking for 60 seconds at the temperatures shown in Table 1. Then, the resist was developed by a paddle method with alkali using an aqueous solution of 2.38 wt % tetramethylammonium hydroxide for 1 minute at 23° C., washed with pure water, and dried to produce a resist pattern.

The results of evaluation of each resist are shown in Table 1.

TABLE 1

|  | Copolymer | Pre-bake temperature (° C.) | Post-bake temperature (° C.) | Sensitivity (mJ/cm$^2$) | Resolution (μm) | Pattern configuration | Heat resistance (° C.) |
| --- | --- | --- | --- | --- | --- | --- | --- |
| Example 1 | A-1 | 140 | 150 | 22 | 0.22 | Good | 140 |
| Example 2 | A-2 | 140 | 150 | 31 | 0.21 | Good | 140 |
| Example 3 | A-3 | 140 | 150 | 30 | 0.22 | Good | 140 |
| Example 4 | A-4 | 140 | 150 | 21 | 0.21 | Good | 140 |
| Example 5 | A-5 | 90 | 100 | 29 | 0.20 | Good | 130 |
| Example 6 | A-6 | 90 | 100 | 19 | 0.22 | Good | 130 |
| Comparative Example 1 | a-1 | 140 | 140 | 38 | 0.27 | *1 | 130 |
| Comparative Example 2 | a-2 | 90 | 100 | 34 | 0.21 | *2 | 110 |

*1 The effect of standing wave was conspicuous.
*2 There was an effect of standing wave.

The radiation sensitive resin composition of the present invention exhibits high resolution, superb capability of producing superior pattern forms, and excellent resistance to PED, higher process stability. The composition is affected by a standing wave only to a minimum extent, possesses prominent heat resistance and, in addition, is sensitive to various types of radiation such as ultraviolet light, deep ultraviolet light, x-rays, or charged particle rays. This composition is therefore very useful as a chemically amplified positive tone resist for the manufacture of semiconductor devices which are expected to be miniaturized in the future.

Obviously, numerous modifications and variations of the present invention are possible in light of the above teachings. It is therefore to be understood that within the scope of the appended claims, the invention may be practiced otherwise than as specifically described herein.

We claim:

1. A radiation sensitive resin composition comprising,
(A) a copolymer which becomes soluble in an alkali developing solution by the action of an acid, the copolymer containing a recurring unit (I) having a structure which is decomposed by the action of an acid and increases the solubility in an alkaline developing solution and a recurring unit(II) obtained from a compound having at least two (meth)acryloyl groups in the molecule by the cleavage of the carbon-carbon double bond, and
(B) a photoacid generator which produces an acid on being irradiated by a radiation.

2. The radiation sensitive resin composition according to claim 1, wherein the recurring unit (I) has a structure capable of producing an acidic functional group when decomposed by the action of an acid.

3. The radiation sensitive resin composition according to claim 2, wherein the acidic functional group is a carboxyl group or a phenolic hydroxyl.

4. The radiation sensitive resin composition according to claim 1, wherein the recurring unit (I) is formed from at least one monomer selected from the group consisting of t-butyl (meth)acrylate, tetrahydropyranyl (meth)acrylate, 2-methoxyethyl (meth)acrylate, 2-ethoxyethyl (meth)acrylate, 2-t-butoxycarbonylethyl (meth)acrylate, 2-benzyloxy-carbonylethyl (meth)acrylate, 2-phenoxycarbonylethyl (meth)acrylate, 2-cyclohexyloxycarbonylethyl (meth)acrylate, 2-isobornyloxycarbonylethyl (meth)acrylate, 2-tricyclodecanyloxycarbonylethyl (meth)acrylate, o-(t-butoxycarbonylmethoxy)styrene, m-(t-butoxycarbonylmethoxy)styrene, p-(t-butoxycarbonylmethoxy)styrene, p-(1-methoxyethoxy)styrene, p-(1-ethoxyethoxy)styrene, p-(1-n-propoxyethoxy)styrene, p-(1-i-propoxyethoxy) styrene, p-(1-cyclohexyloxyethoxy)styrene, p-(1-isobornyloxyethoxy) styrene, p-acetoxystyrene, t-butoxycarbonyloxystyrene, t-butoxystyrene, and α-methyl substituted isomers of these compounds.

5. The radiation sensitive resin composition according to claim 1, wherein the recurring unit (II) is formed from at least one monomer selected from the group consisting of ethylene glycol di(meth)acrylate, diethylene glycol di(meth)acrylate, triethylene glycol di(meth)acrylate, propylene glycol di(meth)acrylate, dipropylene glycol di(meth)acrylate, tripropylene glycol di(meth)acrylate, butanediol di(meth)acrylate, trimethylolpropane di(meth)acrylate, trimethylolpropane tri(meth)acrylate, pentaerythritol tri(meth)acrylate, pentaerythritol tetra(meth)acrylate, tricyclodecanedimethanol di(meth)acrylate, trimethylolpropane tri(meth)acrylate, N,N'-methylene-bis-(meth)acrylamide, a polyalkylene glycol di(meth)acrylate shown by the following formula (1),

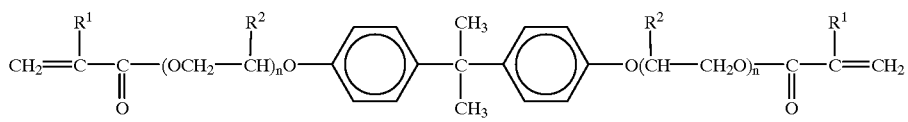

(1)

wherein R¹ and R² individually represent a hydrogen atom or a methyl group, and n is an integer of 1–5, or an epoxy (meth)acrylate which is shown by the following formula (2),

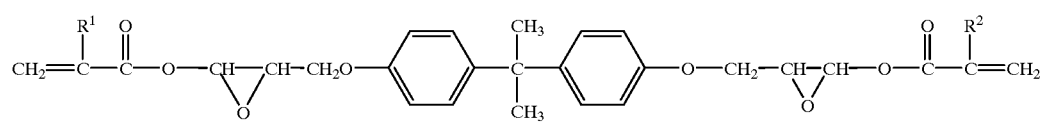

(2)

wherein R¹ and R² are the same as defined for the formula (1).

6. The radiation sensitive resin composition according to claim 1, wherein the contents of the recurring unit (I) and the recurring unit (II) in the copolymer (A) are respectively 10–70 wt % and 0.1–30 wt %.

7. The radiation sensitive resin composition according to claim 1, wherein the copolymer (A) has a polystyrene-reduced weight average molecular weight measured by gel permeation chromatography (GPC) of from 10,000 to 500,000.

8. The radiation sensitive resin composition according to claim 1, wherein the photoacid generator is one or more compounds selected from the group consisting of (a) onium salt compounds, (b) sulfone compounds, (c) sulfonate compounds, (d) sulfonimide compounds, and (e) diazomethane compounds.

9. The radiation sensitive resin composition according to claim 8, wherein (a) onium salt compound is selected from the group consisting of diphenyliodonium trifluoromethanesulfonate, diphenyliodonium pyrenesulfonate, diphenyliodonium dodecylbenzenesulfonate, triphenylsulfonium trifluoromethanesulfonate, diphenyliodonium hexafluoroantimonate, triphenylsulfonium naphthalenesulfonate, triphenylsulfonium camphorsulfonate, and (hydroxydiphenyl)benzylmethylsulfonium toluenesulfonate.

10. The radiation sensitive resin composition according to claim 8, wherein (b) sulfone compound is selected from the group consisting of phenacylphenyl sulfone, mesitylphenacyl sulfone, bis(phenylsulfonyl)methane, and 4-trisphenacyl sulfone.

11. The radiation sensitive resin composition according to claim 8, wherein (c) sulfonate compound is selected from the group consisting of benzointosylate, pyrogallol tristrifluoromethanesulfonate, pyrogallol trimethanesulfonate, nitrobenzyl-9,10-diethoxyanthracene-2-sulfonate, α-methylolbenzointosylate, α-methylolbenzoin-octanesulfonate, α-methylolbenzoin trifluoromethanesulfonate, and α-methylolbenzoindodecylsulfonate.

12. The radiation sensitive resin composition according to claim 8, wherein (d) sulfonimide compound is selected from the group consisting of:

N-(trifluoromethylsulfonyloxy)succinimide,
N-(trifluoromethylsulfonyloxy)phthalimide,
N-(trifluoromethylsulfonyloxy)diphenylmaleimide,
N-(trifluoromethylsulfonyloxy)bicyclo[2.2.1]hepto-5-ene-2,3-dicarboximide, N-(trifluoromethylsulfonyloxy)-7-oxabicyclo[2.2.1]hepto-5-ene-2,3-dicarboximide, N-(trifluoromethylsulfonyloxy)bicyclo[2.2.1]heptane-5,6-oxy-2,3-dicarboximide, N-(trifluoromethylsulfonyloxy)-naphthylimide, N-(camphorsulfonyloxy)succinimide, N-(camphorsulfonyloxy)phthalimide, N-(camphorsulfonyloxy)diphenylmaleimide, N-(camphorsulfonyloxy)bicyclo[2.2.1]-hepto-5-ene-2,3-dicarboximide, N-(camphorsulfonyloxy)-7-oxabicyclo[2.2.1]hepto-5-ene-2,3-dicarboximide, N-(camphorsulfonyloxy)bicyclo[2.2.1]heptane-5,6-oxy-2,3-dicarboximide, N-(camphorsulfonyloxy)naphthylimide, N-(camphorsulfonyloxy)naphthyldicarboximide, N-(4-methylphenylsulfonyloxy)succinimide, N-(4-methylphenylsulfonyloxy)phthalinide, N-(4-methylphenylsulfonyloxy)diphenylmaleimide, N-(4-methylphenylsulfonyloxy)bicyclo-[2.2.1]-hepto-5-ene-2,3-dicarboximide, N-(4-methylphenylsulfonyloxy)-7-oxabicyclo[2.2.1]hepto-5-ene-2,3-dicarboximide, N-(4-methylphenylsulfonyloxy)bicyclo[2.2.1]-heptane-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hepto-5-ene-2,3-dicarboximide, N-(2-trifluoromethylphenyl-sulfonyloxy)-7-oxabicyclo[2.2.1]hepto-5-ene-2,3-dicarboximide, N-(2-trifluoromethylphenylsulfonyloxy)-bicyclo[2.2.1]heptane-5,6-oxy-2,3-dicarboximide, N-(2-trifluoromethylphenylsulfonyloxy)naphthylimide, N-(4-trifluoromethylphenylsulfonyloxy)naphthylimide, N-(4-fluorophenylsulfonyloxy)succinimide, N-(4-fluorophenylsulfonyloxy)phthalimide, N-(4-fluorophenylsulfonyloxy)diphenylmaleimide, N-(4-fluorophenylsulfonyloxy)bicyclo[2.2.1]hepto-5-ene-2,3-dicarboximide, N-(trifluoromethylsulfonyloxy)-7-oxabicyclo[2.2.1]hepto-5-ene-2,3-dicarboximide, N-(4-fluorophenylsulfonyloxy)bicyclo[2.2.1]heptane-5,6-oxy-2,3-dicarboximide, and N-(4-fluorophenylsulfonyloxy)-naphthyldicarboximide.

13. The radiation sensitive resin composition according to claim 8, wherein (e) diazomethane compound is selected from the group consisting of:

bis(trifluoromethylsulfonyl)diazomethane, bis(cyclohexylsulfonyl)diazomethane, bis(phenylsulfonyl)-diazomethane, bis(p-toluenesulfonyl)diazomethane, methylsulfonyl-p-toluenesulfonyldiazomethane, 1-cyclohexyl-sulfonyl-1-(1,1-dimethylethylsulfonyl)diazomethane, and bis(1,1-dimethylethylsulfonyl)diazomethane.

14. The radiation sensitive resin composition according to claim 8, wherein the content of the photoacid generator (B) is 1–20 parts by weight for 100 parts by weight of the copolymer (A).

15. The radiation sensitive resin composition according to claim 1, further comprising (C) an acid diffusion control agent which controls diffusion of the acid generated by irradiation of the photoacid generator (B) in resist films, thereby controlling undesired chemical reactions in the area which has not been exposed to radiation.

16. The radiation sensitive resin composition according to claim 15, wherein the acid diffusion control agent (C) is one or more compound selected from the group consisting of nitrogen-containing organic compounds having the formula $R^6R^7R^8N$, wherein $R^6$, $R^7$, and $R^8$ individually represent a hydrogen atom, alkyl group, aryl group, or aralkyl group, diamino compounds having two nitrogen atoms in the molecule, polymers containing three or more nitrogen atoms, amide group-containing compounds, urea compounds, and nitrogen-containing heterocyclic compounds.

17. A radiation sensitive resin composition comprising, (A) a copolymer which becomes soluble in an alkali developing solution by the action of an acid, the copolymer containing a recurring unit (I) having a structure which is decomposed by the action of an acid and increases the solubility in an alkaline developing solution and a recurring unit(II) obtained from a compound having at least two (meth)acryloyl groups in the molecule by the cleavage of the carbon-carbon double bond, (B) a photoacid generator which produces an acid on being irradiated by a radiation, and (C) an acid diffusion control agent.

18. The radiation sensitive resin composition according to claim 17, comprising the photoacid generator (B) and the acid diffusion control agent (C) in the amount of 1–20 parts by weight and 0.001–10 part by weight, respectively, for 100 parts by weight of the copolymer (A).

19. The radiation sensitive resin composition according to claim 1 or claim 17, which is dissolved in a solvent and prepared into a solution with a solid concentration of 3–50 wt % when used.

20. The radiation sensitive resin composition according to claim 1 or claim 17, wherein the radiation is an ultraviolet ray, deep ultraviolet ray, X-ray, or charged particle ray.

* * * * *